United States Patent [19]

Langlais et al.

[11] Patent Number: 5,062,125
[45] Date of Patent: Oct. 29, 1991

[54] STATISTIC CODING ARRANGEMENT FOR PRODUCING CODE WORDS COMPRISING A VARIABLE NUMBER OF BITS

[75] Inventors: Thierry Langlais, Paris; Jean-Yves Boisson, Clamart; Francoise Moliere, Paris, all of France

[73] Assignee: Telecommunications Radioelectriques et Telephoniques, Paris, France

[21] Appl. No.: 389,721

[22] Filed: Aug. 4, 1989

[30] Foreign Application Priority Data

Aug. 5, 1988 [FR] France .................. 88 10617

[51] Int. Cl.$^5$ ............................................. H04B 1/66
[52] U.S. Cl. ........................................ 375/122; 341/67
[58] Field of Search .................. 358/13, 133, 138, 426, 358/430, 432; 382/56; 381/31; 341/61, 67, 95, 65; 370/83, 118; 375/122

[56] References Cited

U.S. PATENT DOCUMENTS

| | | | |
|---|---|---|---|
| 4,107,648 | 8/1978 | Frank | 382/56 |
| 4,517,596 | 5/1985 | Suzuki | 358/133 |
| 4,562,456 | 12/1985 | Bolger | 358/13 |
| 4,593,267 | 6/1986 | Kuroda et al. | 341/67 |

FOREIGN PATENT DOCUMENTS 0098153  1/1984  European Pat. Off. .
3602808  6/1987  Fed. Rep. of Germany .

OTHER PUBLICATIONS

IBM Technical Disclosure Bulletin; vol. 23, No. 3, Aug. 1980, pp. 1211–1216, "Serial-by-Character Data Compactor/Expander".

Primary Examiner—Benedict V. Safourek
Attorney, Agent, or Firm—Michael E. Marion

[57] ABSTRACT

This arrangement has an input (10) for receiving the information to be encoded in the form of fixed words comprising a number of bits, a first transcoding member (20) for applying said variable word to "n" outputs among n parallel outputs, a second transcoding member (22) for supplying from its output the indication of the length (n), and an accumulation member (30) for forming a first "modulo N" accumulated information and a second "modulo 2N" accumulated information, which are the result of operations performed on "n". A cyclic permutation circuit (32) supplies a permuted word which represents the permuted variable code word as a function of the first accumulated information, switching circuit (35) selectively transfers as a function of the second accumulated information the bits of the permuted word to a first and/or to a second register, and detection circuit (30,45) cooperates with the accumulation member for detecting the fill level of one of said registers to act on the transfer circuit so as to transfer the content of the filled register to the output.

1 Claim, 4 Drawing Sheets

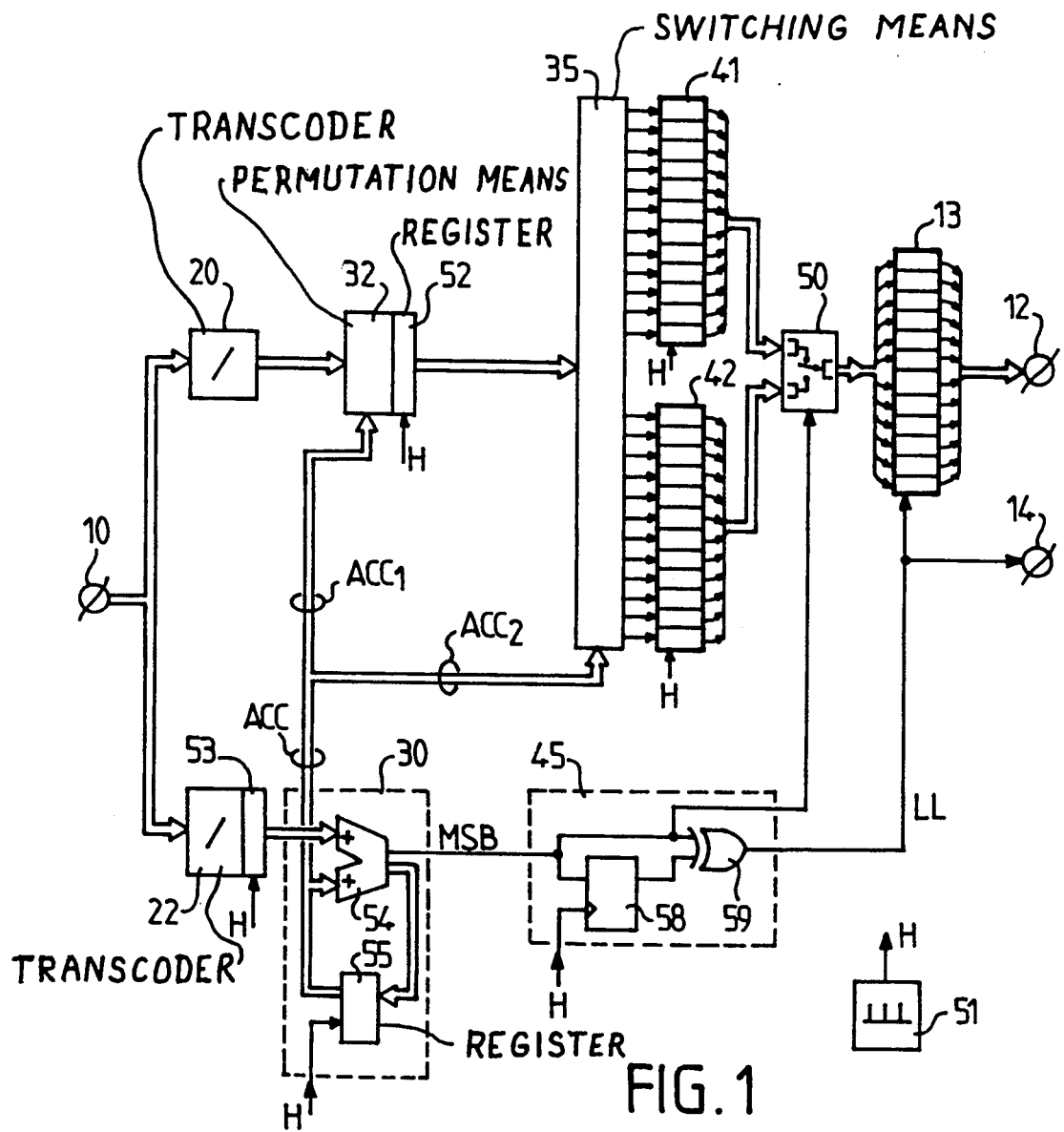
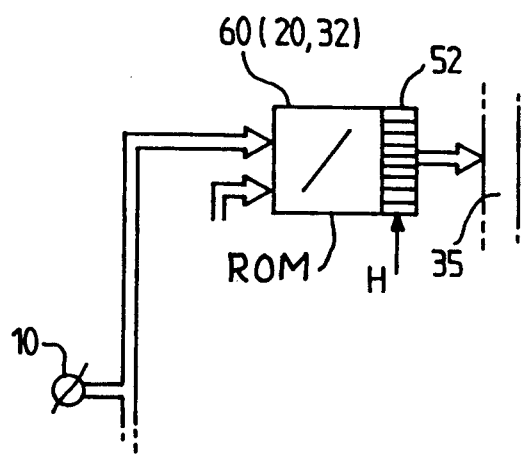
FIG. 1
FIG. 2

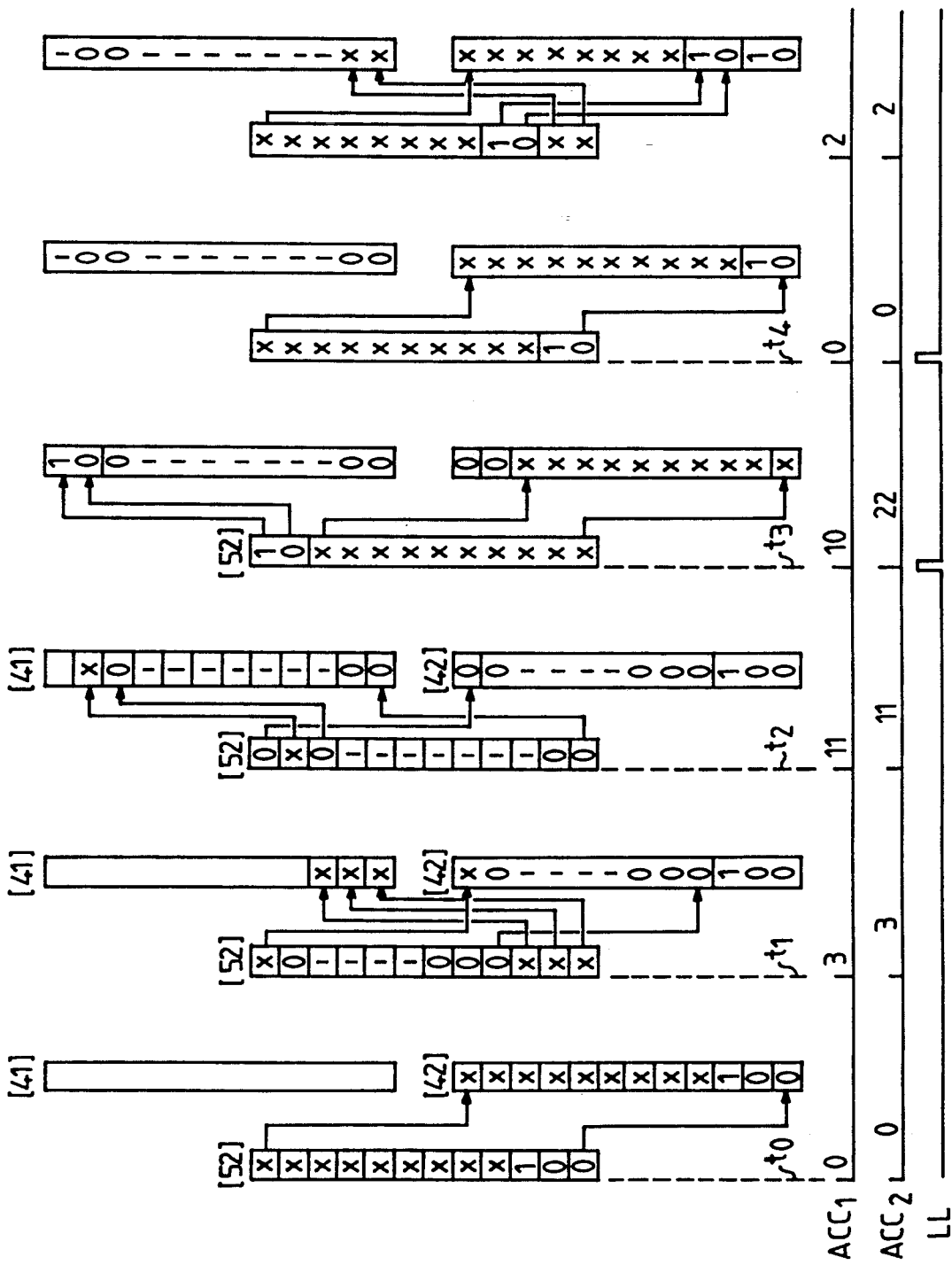

STATISTIC CODING ARRANGEMENT FOR PRODUCING CODE WORDS COMPRISING A VARIABLE NUMBER OF BITS

BACKGROUND OF THE INVENTION

The invention relates to a statistic coding arrangement for producing variable length code words comprising a variable number "n" of bits (n varying from 1 to N), the arrangement having an input for receiving the information to be encoded as words comprising a fixed number of bits, a first transcoding member for applying said variable length words to "n" outputs among N parallel outputs, a second transcoding member for supplying from its output the indication of the length "n".

Such arrangements are used with great advantage if one wants to reduce the information bit rate. By this encoding operation, a statistic of the words to be encoded is established. A variable length word of short length is assigned to the words which occur most often and a variable length word of great length is assigned to words of rare ocurrence. This encoding mode is particularly interesting in the field of signal transmission for which it is known to recover statistic quantities (example: speech, images, text) since it renders it possible to considerably reduce the bit rate without altering the information.

A problem to be solved for these encoders in the field of television is the processing rate; actually, each picture element must be encoded at a rate of 1/13.5 MHz.

Such an arrangement is described in the German Patent Application No. 3602808. However this application does not describe the means which are essential to obtain a high processing speed.

SUMMARY OF THE INVENTION

The present invention has for its object to provide an arrangement of the type defined in the opening paragraph, by means of which it is possible to obtain a high processing speed with simple circuits of current usage.

To that end, such an arrangement is characterized in that it is furthermore provided with:

an accumulation member for forming a first "modulo N" accumulated information and a second "modulo 2N" accumulated information which are the result of operations performed on "n", cyclic permutation means for producing a permuted word which represents the permuted variable length code word as a function of the first accumulated information, switching means for selectively transferring as a function of the second accumulated information the bits of the permuted word to a first and/or a second register, detection means cooperating with the accumulation member for detecting the fill level of one of said registers to act on the transfer means so as to transfer the content of the filled register to the output.

BRIEF DESCRIPTION OF THE DRAWINGS

The following description which is given by way of non-limitative example with reference to the accompanying drawings will make it better understood how the invention can be put into effect.

FIG. 1 shows an encoding arrangement according to the invention.

FIG. 2 shows a preferred embodiment for combining the permutation member with the first transcoding member.

FIG. 5 is a diagram intended to make it understood how the encoding arrangement in accordance with the invention functions.

DETAILED DESCRIPTION OF THE INVENTION

Figure 3:
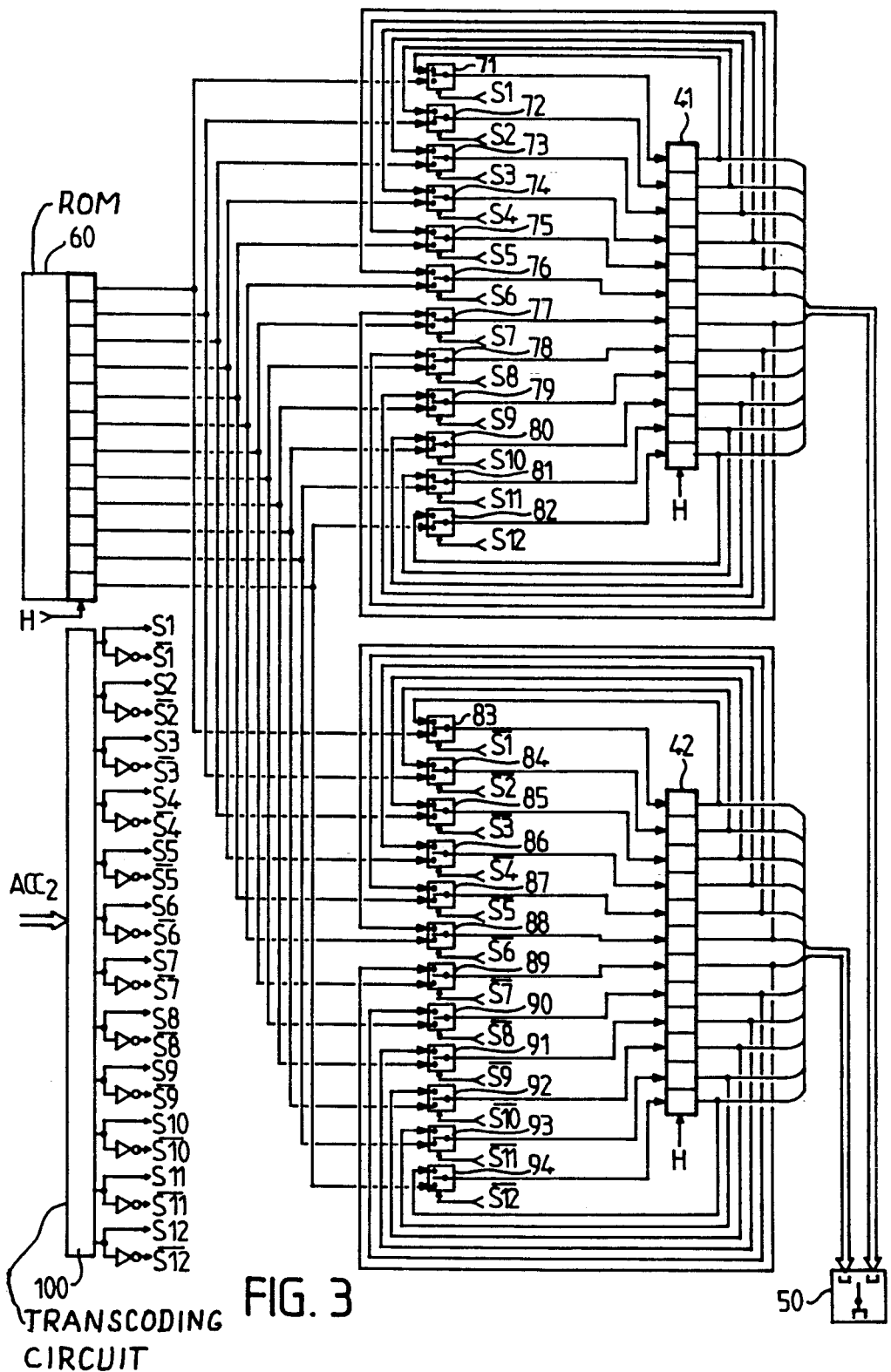
FIG. 3 is a detailed representation of the switching circuit and its interconnection to the first and the second register.

The arrangement according to the invention shown in FIG. 1 has an input 10 to receive an input code to be converted. This code appears in the form of m parallel bits to represent $M=2^m$ information words, for example $m=4$ and $M=16$. 16 information words W1 to W16 can then be encoded. A statistic code word whose length may vary from a minimum number to a maximum number N, for example $N=12$, corresponds to each of these words. The following Table I gives these words in the column 2 in correspondance with the input words listed in column 1.

These variable words appear at the output 12 of an output register accompanied by a validation signal LL which appears at the output 14.

The arrangement includes a first transcoding member 20 which from the input words supplies the variable words from a few of its twelve outputs. The variable words always start at the first positions of these outputs as is indicated in column 3 of Table I. The other positions which are not occupied by the statistic word may either be "1" or "0", which is indicated by "X" in column 3 of Table I. A second transcoding member 22 whose input is connected, as is also the input of the member 20, to the input 10 supplies a binary code which gives an indication of the length of the number of bits from which the variable word is assembled.

TABLE I

| Column 1 Input code (decimal) notation | Column 2 Statistic twelve bits at (binary) notation | Column 3 Statistic code effected on Length code the output of the converter 20 | Column 4 (in decimal) notation |
|---|---|---|---|
| W8 | 1 | 1XXXXXXXXXXX | 1 |
| W7 | 01 | 01XXXXXXXXXX | 2 |
| W9 | 001 | 001XXXXXXXXX | 3 |
| W6 | 00010 | 00010XXXXXXX | 5 |
| W10 | 000110 | 000110XXXXXX | 6 |
| W11 | 0001110 | 0001110XXXXX | 7 |
| W5 | 00011110 | 00011110XXXX | 8 |
| W4 | 00011111110 | 00011111110X | 11 |
| W12 | 000111111111 | 000111111111X | 11 |
| W13 | 000111111011 | 000111111011 | 12 |
| W3 | 000111111010 | 000111111010 | 12 |
| W14 | 000111111001 | 000111111001 | 12 |
| W2 | 000111111000 | 000111111000 | 12 |
| W15 | 000111110111 | 000111110111 | 12 |
| W1 | 000111110110 | 000111110110 | 12 |
| W16 | 000000111111 | 000000111111 | 12 |

X = either 0 or 1.

In accordance with the invention, the arrangement comprises:

at the output of the transcoding member 22 an accumulation member 30 for forming a first accumulated information ACC1, which is the result of the accumulation effected modulo "N" on the length indications and a second information representing an ACC2 which is the result of a accumulation which this time is effected modulo "2N", cyclic permutation means 32 for supplying a permuted word which represents the variable code word, permuted as a function of the accumulated information, switching means 35 for selectively transferring the elements of the permuted wor to a first or to a second register 41 and 42, detection means 45 which cooperate with the accumulation member 30 for detecting the fill level of the first or the second register to act on the transfer means 50 which transfers the filled register towards the output 12 passing through the register 30. A clock 51 produces a signal H which fixes the operating rate of the arrangement. The clock H is the input clock of the data in the system, which dictates the processing rate. The output frequency of the data on the N-bit bus is less than or equal to the output rate of the clock H, which is the main advantage of the system. This signal H acts on the loading commands of the registers 52 and 53 which are coupled to the outputs of the members 32 and 22.

The accumulation member 30 is constituted by an adder 54 which adds the length indication coming from the second transcoding member 22 to the content of an accumulation register 55 whose input is connected to the output of the adder 54. The detection means 55 utilize the signal MSB which represents the most significant bit at the output of the adder 54. The value MSB determines the position of a multiplexer 50 which partially constitutes the transfer means. The transfer of the registers 41 or 42 to the output register 13 is only effective when the signal LL is processed, this signal acting on the load command of the register 13. To process this signal LL a bistable multi-vibrator of the type D 58 is used which at each active edge of the signal H stores the signal MSB; an "exclusive-OR" gate 59 whose inputs are connected to the input and to the output of this bistable multi-vibrator produces this signal LL. This signal LL is consequently active at each change in the value MSB.

The accumulation member 30 produces an accumulated sum ACC1 which is a modulo "N" sum for the permutation member 32 and a modulo "2N" accumulated sum ACC2 for the switching circuit 35 as has already been mentioned in the foregoing.

In accordance with a preferred embodiment, the permutation means 32 are combined with the transcoding member 20 so that a read-only memory 60 (see FIG. 2) can be programmed such as to effect this combination in the manner indicated by Table II. The permutation order is given by an information ACC1 which indicates a permutation ranging from 1 to 12. Table II indicates the agreement between the code at the output of the memory 60 for two values of the input code (5 and 4) and the values of PM which vary from 1 to M. It will then be easy for a person skilled in the art to effect programming of this memory for any value of the input code.

TABLE II

| ACC1 | Input code W5 | Input code W4 |
|---|---|---|
| 0 | 00011110XXXX | 00011111110X |
| 1 | X00011110XXX | X00011111110 |
| 2 | XX00011110XX | 0X0001111111 |
| 3 | XXX00011110X | 10X000111111 |

TABLE II-continued

| ACC1 | Input code W5 | Input code W4 |
|---|---|---|
| 4 | XXXX00011110 | 110X00011111 |
| 5 | 0XXXX0001111 | 1110X0001111 |
| 6 | 10XXXX000111 | 11110X000111 |
| 7 | 110XXXX00011 | 111110X00011 |
| 8 | 1110XXXX0001 | 1111110X0001 |
| 9 | 11110XXXX000 | 11111110X000 |
| 10 | 011110XXXX00 | 011111110X00 |
| 11 | 0011110XXXX0 | 0011111110X0 |

FIG. 3 illustrates a detailed diagram of the switching circuit and its connections to the registers 41 and 42.

This circuit is formed by a first series of dual-input change-over switches 71 to 82 which are controlled by the respective control signals S1 to S12 and a second series 83 to 94 controlled by the signals S1 to S12 which are the complementary versions of the preceding signals. The outputs of the change-over switches 71 to 82 are connected to the respective parallel inputs of the register 41. The outputs of the change-over switches 83 to 94 are connected to the parallel inputs of the register 42. The first inputs of the change-over switches 71 to 82 are connected to the respective parallel outputs of the register 41, and the first inputs of the change-over switches 83 to 94 are connected to the outputs of the register 42. The second inputs of the change-over switches 71 to 94 are connected to the outputs of the read-only memory 60.

The signals S1 to S12 and the signals S1 to S12 derived from the preceding signals by logic inversion are generated by a transcoding circuit 100 which can easily be programmed as a function of the following Table III wherein the value "1" for the signals S1 to S12 indicates that the second input is linked to the output 60 and the value "0" indicates, because of the feedback of the output to the input, that the bit value does not change.

TABLE III

| ACC2 (in decimal) notation | S1 | S2 | S3 | S4 | S5 | S6 | S7 | S8 | S9 | S10 | S11 | S12 |
|---|---|---|---|---|---|---|---|---|---|---|---|---|
| 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 1 |
| 2 | 0 | 0 | 0 | 0 | 0 | 0 | 0 | 0 | 0 | 0 | 1 | 1 |
| 3 | 0 | 0 | 0 | 0 | 0 | 0 | 0 | 0 | 0 | 1 | 1 | 1 |
| 4 | 0 | 0 | 0 | 0 | 0 | 0 | 0 | 0 | 1 | 1 | 1 | 1 |
| 5 | 0 | 0 | 0 | 0 | 0 | 0 | 0 | 1 | 1 | 1 | 1 | 1 |
| 6 | 0 | 0 | 0 | 0 | 0 | 0 | 1 | 1 | 1 | 1 | 1 | 1 |
| 7 | 0 | 0 | 0 | 0 | 0 | 1 | 1 | 1 | 1 | 1 | 1 | 1 |
| 8 | 0 | 0 | 0 | 0 | 1 | 1 | 1 | 1 | 1 | 1 | 1 | 1 |
| 9 | 0 | 0 | 0 | 1 | 1 | 1 | 1 | 1 | 1 | 1 | 1 | 1 |
| 10 | 0 | 0 | 1 | 1 | 1 | 1 | 1 | 1 | 1 | 1 | 1 | 1 |
| 11 | 0 | 1 | 1 | 1 | 1 | 1 | 1 | 1 | 1 | 1 | 1 | 1 |
| 12 | 1 | 1 | 1 | 1 | 1 | 1 | 1 | 1 | 1 | 1 | 1 | 1 |
| 13 | 1 | 1 | 1 | 1 | 1 | 1 | 1 | 1 | 1 | 1 | 1 | 0 |
| 14 | 1 | 1 | 1 | 1 | 1 | 1 | 1 | 1 | 1 | 1 | 0 | 0 |
| 15 | 1 | 1 | 1 | 1 | 1 | 1 | 1 | 1 | 1 | 0 | 0 | 0 |
| 16 | 1 | 1 | 1 | 1 | 1 | 1 | 1 | 1 | 0 | 0 | 0 | 0 |
| 17 | 1 | 1 | 1 | 1 | 1 | 1 | 1 | 0 | 0 | 0 | 0 | 0 |
| 18 | 1 | 1 | 1 | 1 | 1 | 1 | 0 | 0 | 0 | 0 | 0 | 0 |
| 19 | 1 | 1 | 1 | 1 | 1 | 0 | 0 | 0 | 0 | 0 | 0 | 0 |
| 20 | 1 | 1 | 1 | 1 | 0 | 0 | 0 | 0 | 0 | 0 | 0 | 0 |
| 21 | 1 | 1 | 1 | 0 | 0 | 0 | 0 | 0 | 0 | 0 | 0 | 0 |
| 22 | 1 | 1 | 0 | 0 | 0 | 0 | 0 | 0 | 0 | 0 | 0 | 0 |
| 23 | 1 | 0 | 0 | 0 | 0 | 0 | 0 | 0 | 0 | 0 | 0 | 0 |

The encoding arrangement according to the invention operates as follows.

Figure 4:
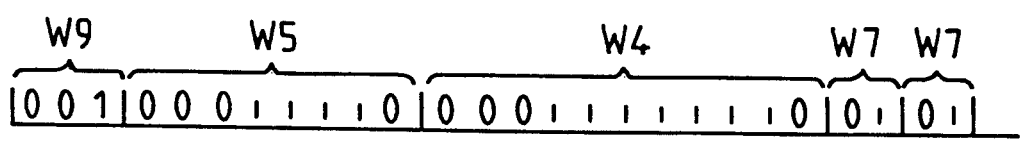
FIG. 4 shows a sequence of words to be encoded and the expected result.

Let it be assumed that the words W9, W5, W4, W7, W7, . . . are to be encoded sequentially. FIG. 4 shows, in accordance with these words the sequence of bits they imply.

Let it be assumed that the word W9 appears after the coding operation effected by the memory 60 at the instant to in the register 52, and let it also be assumed that at this instant the accumulated sums ACC1 and ACC2 are equal to "0". In conformity with Tables II and III the statistic code is not permuted and the total content of the register 52 is transferred to the register 42. At the instant t1 a new code appears in the register 52, the code is permuted by the value "3" which corresponds to the length of the preceding code. As a result thereof the change-over switches 80, 81 and 82 authorize the transfer of the first three positions of the register 52 to the first three positions of the register 41. The last nine positions of the register 52 are transferred to the last nine positions of the register 42. At the instant t2, ACC1 and ACC2 assume the values "11", which entails a permutation of 11 times the variable word corresponding to the word W4 and the transfer of the last eleven positions of the register 52 to the register 41 and the first position to the first position of the register 42.

At the instant t3 the signal MSB has changed its value, so that the values ACC1 and ACC2 become different, but the signal LL becomes active so that the content of the register 42 will be transferred to the output register 13. At the instant t4 there will also be a change in the value of MSB, which also produces an active signal from LL.

We claim:

1. A statistic coding arrangement for producing variable length code words comprising a variable number "n" of bits (n varying from 1 to a maximum of N), the arrangement comprising:

and input for receiving the information to be encoded as fixed length words comprising a fixed number of bits, a first transcoding member for applying said variable length word to "n" outputs among N parallel outputs, a second transcoding member for supplying from its output the indication of the length "n", accumulation means for forming a first "modulo N" accumulated information and a second "modulo 2N" accumulated information which are the results of operations performed on "n", cyclic permutation means for producing a permuted word which represents the permuted variable code word as a function of the first accumulated information, first and second registers, transfer and switching means for selectively transferring as a function of the second accumulated information the bits of the permuted word to the first and/or second register, and detection means cooperating with the accumulation means for detecting the fill level of one of said registers to act on the transfer means so as to transfer the content of the filled register to the output.

* * * * *